United States Patent [19]

Noble

[11] 4,339,300
[45] Jul. 13, 1982

[54] PROCESS FOR SMOOTHING SURFACES OF CRYSTALLINE MATERIALS

[76] Inventor: Lowell A. Noble, 18138 Bancroft Ave., Monte Sereno, Calif. 95030

[21] Appl. No.: 818,817

[22] Filed: Jul. 25, 1977

[51] Int. Cl.³ .............................................. C30B 23/08
[52] U.S. Cl. ................................... 156/601; 156/646; 204/192 EC
[58] Field of Search .................... 204/192 E, 192 EC; 156/646, 601, 613, DIG. 65; 264/82

[56] References Cited

U.S. PATENT DOCUMENTS 3,753,775  8/1973  Robinson et al. .................... 156/646
3,941,672  3/1976  Tanaka et al. ............... 204/192 EC
4,038,117  7/1977  Noble et al. ......................... 156/646

FOREIGN PATENT DOCUMENTS 1143374  8/1955  Fed. Rep. of Germany ...... 204/192 EC Primary Examiner—Hiram Bernstein
Attorney, Agent, or Firm—Phillips, Moore, Lempio & Majestic

[57] ABSTRACT

A process for smoothing surfaces of crystalline materials such as sapphire or the like is disclosed which is capable of producing surfaces which are near atomically smooth. The process comprises the steps of substantially atomically removing crystalline material from the surface to be smoothed at a given rate and simultaneously substantially atomically depositing crystalline material on the surface to be smoothed at an independently controlled rate not greater than the given rate of removal. Various embodiments of the process are described in which combinations of evaporation, sputtering, gaseous chemical reaction and reflection of removed material are used to provide the substantially atomic removal and deposition of materials according to this invention.

3 Claims, 6 Drawing Figures

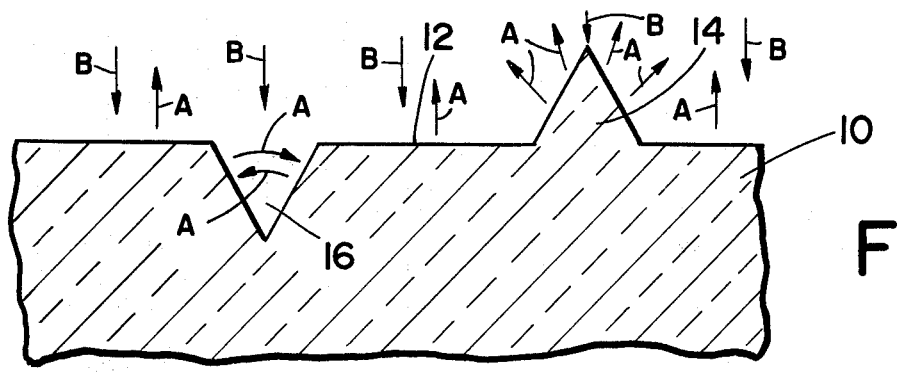
FIG_1
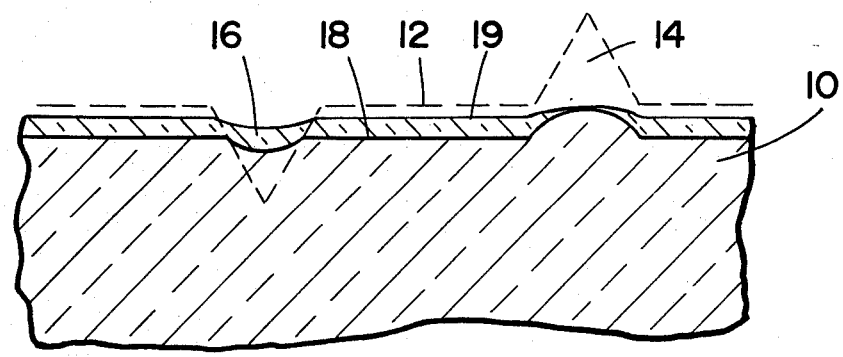
FIG_2
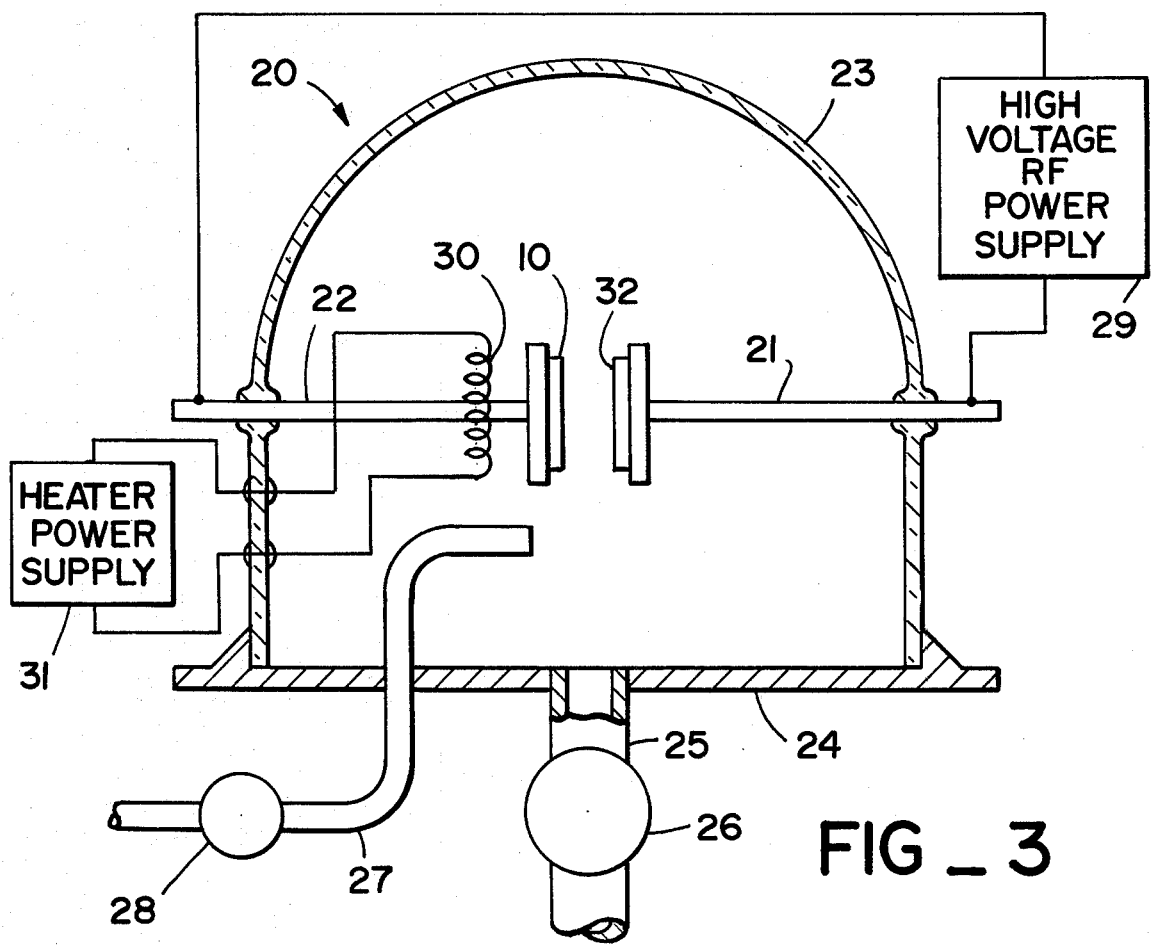
FIG_3

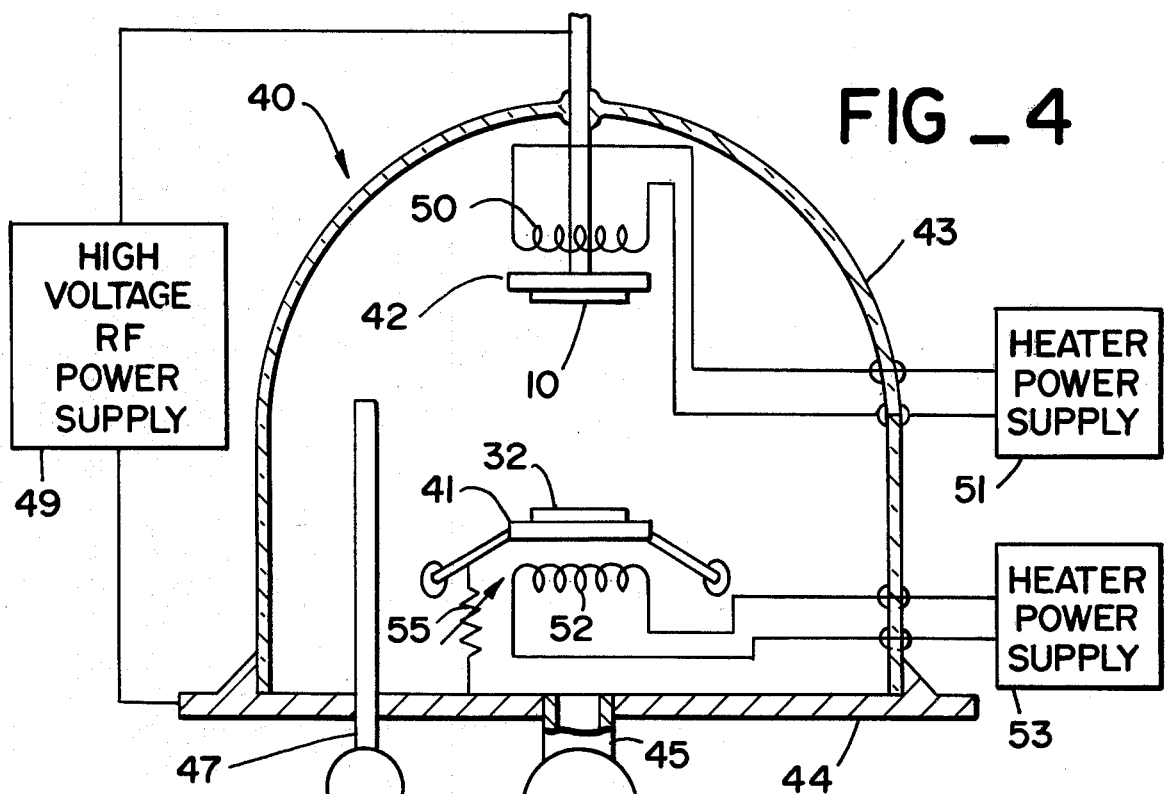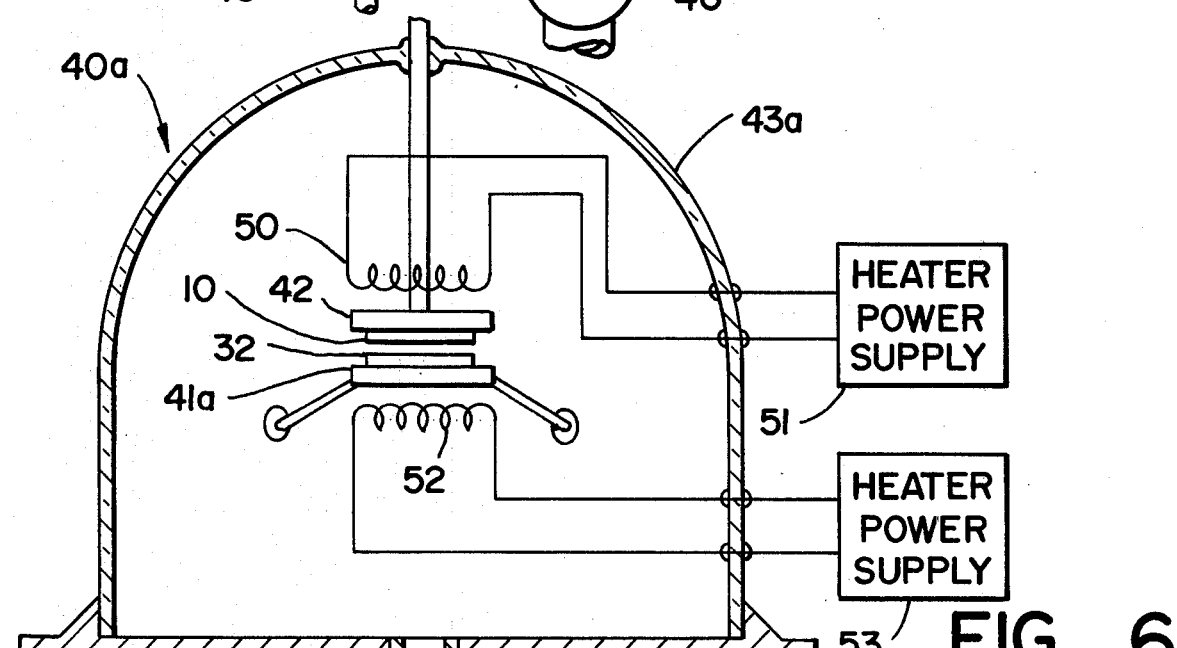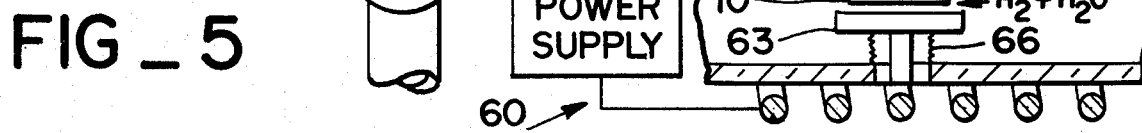

PROCESS FOR SMOOTHING SURFACES OF CRYSTALLINE MATERIALS

CROSS-REFERENCE TO RELATED APPLICATION

Applicant is named as a joint inventor in U.S. patent application Ser. No. 610,156, filed Sept. 4, 1975 and entitled PROCESS FOR GAS POLISHING OF SAPPHIRE AND THE LIKE which application issued as U.S. Pat. No. 4,038,117 on July 26, 1977 and discloses and claims a method of surface polishing sapphire and the like based on the heating of the surface to be polished in a substantially static hydrogen gas environment to establish an equilibrium condition at the surface to be polished.

BACKGROUND OF THE INVENTION

This invention relates to the smoothing or polishing of surfaces of crystalline materials such as sapphire and the like to remove microscopic imperfections and more particularly to a process for producing nearly atomically smooth surfaces thereon by removing material from such surface substantially atomically at a given rate and simultaneously depositing identical material on such surface substantially atomically at an independently controlled rate closely approaching and not greater than the given rate of removal.

In the fabrication of a variety of optical and electronic devices bodies of sapphire or the like having at least one flat surface which is as smooth as possible are required. Dielectric substrates for semiconductor devices are one example of such requirements.

Mechanical polishing techniques have been used in the prior art which, with careful attention to detail, are capable of producing surface finishes having no scratches or other surface imperfections visible at magnifications of 400×. Further improvement in surface polishing by mechanical techniques can only be obtained at great expense in terms of time as well as money and where the body to be polished is made of soft material or material which is hygroscopic, mechanical polishing techniques present further problems.

Thus, in the prior art, a number of chemical polishing techniques have been developed based on the use of liquid, vapor or gaseous etchants. Such techniques have included the steps of heating the body to an elevated temperature below the melting point thereof and then subjecting the surface to be polished to a flowing etchant in an attempt to remove the surface imperfections. However, all of such proposals have the disadvantage that it is difficult to accurately control the etch rate over the surface of the body. Perfectly homogenous mixtures of fluids are difficult, if not impossible, to obtain and maintain and a homogenous flow of gases over the surface to be polished is impossible where the surface has a complex shape and difficult even on flat surfaces due to the very presence of the surface defects which are to be removed. Furthermore, different crystal faces will be etched at different rates resulting in the introduction of surface imperfections due to the etching process itself where different crystal faces are exposed as in the case of single crystal bodies having complex surface shapes or polycrystalline bodies. Thus, etching techniques heretofore proposed have been time consuming and expensive and have tended to introduce surface imperfections or to reinforce the surface imperfections already present, particularly where such imperfections are severe.

U.S. patent application Ser. No. 610,156 (now U.S. Pat. No. 4,038,117) mentioned hereinabove teaches a method of surface polishing bodies of sapphire and the like by heating such body to a temperature of about 1900° C. in a substantially static hydrogen gas environment. At such temperature, a reversible reaction occurs between the alumina and the hydrogen resulting in alumina being simultaneously removed from the surface and redeposited thereon. The result is a superior polishing action providing surfaces having no imperfections visible at magnifications of 1000× and more after one hour of treatment. However, the process is basically an equilibrium process in which a given etching or vaporization rate and a given redeposition rate is established at a given temperature. Thus, it is impossible to vary the redeposition rate without varying the etching or vaporization rate and vice versa.

SUMMARY OF THE INVENTION

Briefly, a crystalline body of sapphire or the like is surface polished according to this invention by heating the body to a temperature less than its melting point and greater than two-thirds of its melting point. Material is then removed from the surface of the body at a given rate and substantially atomically. Simultaneously, material of the same chemical composition is deposited substantially atomically on such surface at a rate closely approaching and not substantially greater than the rate of removal of material therefrom. According to this invention, material may be removed from the surface to be polished by evaporation, sputtering, gaseous chemical reaction, or combinations thereof. Material may be redeposited on the surface to be polished by evaporation, sputtering, gaseous chemical reaction, combinations thereof or reflection onto the surface of materials removed by evaporation, sputtering, gaseous chemical reaction or combinations thereof and either or both the removal rate and the deposition rate must be controllable independently of the other.

BRIEF DESCRIPTION OF THE DRAWING

The foregoing and other objects and features of this invention will be more fully understood from a reading of the following detailed description of preferred embodiments in conjunction with the attached drawing wherein:

FIG. 1 is an enlarged cross-sectional view of the surface of a crystalline body with the polishing action according to the teaching of this invention indicated schematically.

FIG. 2 is a view similar to FIG. 1 schematically illustrating the result of the polishing action according to this invention.

FIG. 3 is a cross-sectional view of a bell jar arrangement suitable for use in practicing a sputtering embodiment of the process of this invention with the electrical/electronic elements of the apparatus shown in block diagram form.

FIG. 4 is a view similar to FIG. 3 showing apparatus for use in practicing a combined sputtering and evaporation embodiment of the process of this invention.

FIG. 5 is a view similar to FIGS. 3 and 4, showing apparatus suitable for use in practicing an evaporation embodiment of the process of this invention.

FIG. 6 is a fragmentary cross-sectional view of apparatus for practicing an embodiment of the process of this invention in which material is removed from the surface to be polished by gaseous chemical reaction and redeposited thereon by reflection of the removed material.

DETAILED DESCRIPTION OF PREFERRED EMBODIMENTS

Referring to FIG. 1, an enlarged fragmentary cross-sectional view of the surface of a crystalline body 10 of sapphire or the like is presented. Imperfections in the surface 12 of the body 10 will either take the form of ridges, ribs, protuberances, etc. represented by the projection 14, or scratches, grooves, holes, etc. represented by the depression 16 in FIG. 1. Material removed from the surface 12 according to the teaching of this invention, is represented schematically by the arrows labeled A in FIG. 1 and materials deposited on the surface 12 according to this invention are represented schematically by the arrows labeled B in FIG. 1.

According to the teaching of this invention, materials are removed from the surface 12 substantially atomically as for example, by evaporation, sputtering or gaseous chemical reaction. As used herein "evaporation" is defined to include "sublimation". This invention is based on the discovery that the differential in the rate of removal at different crystal faces is reduced by simultaneous deposition thereon, that projections from a surface will tend to be preferentially eroded at a higher rate than the average surface of the body whereas less material will tend to be removed at depressions than at the average surface of the body and that the net result may be enhanced by simultaneous removal and deposition. This basic principle is represented schematically in FIG. 1 which shows a number of arrows A concentrated at the projection 14 with the arrows A distributed evenly over the average surface 12 and with the arrows A at the depression 16 indicating that materials removed from the surfaces of the depression tend to become trapped and redeposited within the depression.

The arrows labeled B in FIG. 1 represent the deposition of material on the surface 12 of the body 10 and are evenly distributed over the surface 12 in accordance with the teaching of this invention. Thus, the net result of simultaneous removal and deposition is that material removed from and deposited on the average surface of the body 10 tends to be about equal whereas material is preferentially removed from projections 14 and deposited thereon more thinly than on the average surface, due to the projected area thereof, while material is preferentially trapped within the depression 16.

Referring to FIG. 2, the result of the polishing action according to this invention is illustrated schematically. Thus, the dotted line represents the original surface 12 of the body 10 with its projection 14 and depression 16. The solid line 18 represents the surface that would tend to result from removal only of material from the surface 12 and the solid line 19 represents the surface that will be produced due to the simultaneous deposition of material in accordance with the teaching of this invention.

According to this invention and as indicated in FIG. 2, the rate of deposition of material on the body 10 should be about the same as or slightly less than the rate of removal of material from the body 10. If the rate of deposition of material on the body 10 is substantially greater than the rate of removal of material therefrom, the smoothing or polishing action will be reduced, whereas an effective smoothing or polishing action may still be obtained where the rate of deposition of material is substantially less than the rate at which material is removed from the body 10 although the time required to achieve a given degree of polishing may be increased.

The heating of the body to be polished to an elevated temperature is an important step in the process according to the teaching of this invention. The newly deposited material will be somewhat amorphous, masking the crystal faces exposed at the surface of the body and tending to reduce the differential rate of removal at different faces. Such heating provides mobility of the atoms at the surface to be polished so that atoms returning to such surface may eventually enter into the lattice structure of that face of the crystalline material on which they are received. In addition such heating tends to reduce the rigidity of the body 10 so that surface tension coupled with the mobility of the atoms at such surface can assist in the smoothing action and in the proper incorporation of atoms arriving at the surface into the lattice structure of the crystal faces of the body. However, it has been found that a broad range of temperatures less than the melting temperature of the body and greater than two-thirds of the melting temperature of the body will provide the desired surface effects according to the teaching of this invention provided that the ratio between the removal rate and the deposition rate is optimized for the specific temperature and vice versa.

Thus, it is also an important step according to the teaching of this invention to control either or both the removal rate and the deposition rate independently of the other. Such step is necessary in order to enable the process of this invention to be optimized in terms of quality of the polished surface and the time required to achieve the desired quality of polished surface.

Referring to FIG. 3, the practice of this invention utilizing sputtering techniques both for removing material and for depositing material is illustrated in a bell jar embodiment. The bell jar 20 comprises a pair of oppositely disposed electrodes 21 and 22 mounted through the wall of an insulating dome or jar 23. The open end of the jar 23 is supported in hermetically sealed relation on a platform 24 provided with an appropriate conduit 25 and valve 26 for communicating the interior of the jar 23 with a vacuum system (not shown) for evacuating the interior of the jar 23. The platform 24 is also provided with an appropriate conduit 27 and valve 28 for communicating the interior of the jar 23 with an appropriate source (not shown) of sputtering gas to be introduced into the jar 23 after evacuation thereof. A high voltage RF power supply 29 is connected across the electrodes 21 and 22 and an appropriate heater element 30 is mounted within the jar 23 in proximity to one of the electrodes 22 which heater 30 is connected by means of leads sealed through the wall of the jar 23 to an appropriate heater power supply 31.

The body 10 to be surface polished which may be, for example, a flat plate or disc of single crystal or polycrystalline material such as sapphire or the like, is mounted on the electrode 22 and another body 32 which may also be a flat plate or disc of the same material as the body 10 is mounted on the electrode 21. The bell jar 23 is then evacuated through the conduit 25 and the valve 26 is closed. After evacuation, the valve 28 is opened and the desired sputtering gas is admitted to the interior of the bell jar 23 through the conduit 27. Heater 30 is then energized by means of the power supply 31 and when the body 10 has been raised to the desired elevated temperature, the high voltage RF power supply is activated to establish a high voltage field between the electrodes 21 and 22 sufficient to ionize the sputtering gas and produce sputtering of the surfaces of the bodies 10 and 32 as is known in the art.

The sputtering of materials between the opposed surfaces of the bodies 10 and 32 will tend to be substantially equal. Thus material will be sputtered from the surface of the body 10 onto the surface of the body 32 and simultaneously material will be sputtered from the surface of the body 32 onto the surface of the body 10. However, the fact that the body 10 is maintained at an elevated temperature will not only tend to increase the amount of material sputtered therefrom but will also tend to cause material to be evaporated or sublimated from the surface of the body 10 particularly in view of the fact that the pressure within the bell jar 23 will be subatmospheric. As used herein "evaporation" is defined to include "sublimation". Thus, material will be removed from the surface of the body 10 substantially atomically at a given rate established by the temperature of the body 10 and the sputtering action produced by the high voltage RF field. Simultaneously, material will be sputtered onto the surface of the body 10 from the body 32 due to the sputtering action produced by the high voltage RF field. The rate of removal of material from the surface of the body 10 will tend to be slightly higher than the rate at which material is deposited thereon and such rate of removal may be controlled by adjusting the temperature to which the body 10 is heated by adjusting the power supply 31 for the heater 30. The sputter rate onto body 10 from the body 32 may be further adjusted by controlling the gas pressure, RF voltage and relative geometries of the electrodes.

As pointed out above, sputtering techniques are known in the art and thus the electrodes 21 and 22 are represented schematically and those skilled in the art will use electrodes of various designs in practicing the teaching of this invention. The spacing between the electrodes and thus between the surfaces of the bodies 10 and 32 may be readily selected as can the voltage of the RF power supply and the pressure of the sputtering gas for optimum sputtering according to criteria known in the art. According to the teaching of this invention, the temperature of the body 10 is selected by adjustment of the heater power supply to provide optimum polishing action according to the teaching of this invention. It has been found possible to obtain surface polishes having no imperfections visible at 100,000× magnification through the use of the process according to the teaching of this invention.

Referring to FIG. 4, the practice of this invention utilizing sputtering to remove material from the surface of the body to be polished and evaporation to deposit material thereon is illustrated in a bell jar embodiment. The bell jar 40 according to this embodiment of the invention comprises a support 41 mounted on and an electrode 42 sealed through the wall of an insulating jar 43. The open end of the jar 43 is hermetically mounted on a platform 44 which includes a conduit 45 and valve 46 for evacuating the interior of the jar 43 as described hereinabove in connection with FIG. 3. Similarly, the platform 44 includes a conduit 47 and valve 48 for introducing a selected sputtering gas into the jar 43 as described hereinabove.

According to this embodiment of the invention, the platform 44 is metallic and a high voltage RF power supply 49 is connected between the platform 44 and the electrode 42. A heating element 50 is positioned within the jar 43 adjacent the electrode 42 in heat exchanging relation therewith and connected by means of leads sealed through the wall of the jar 43 to a heater power supply 51. Similarly, a heater element 52 is located within the bell jar 43 adjacent the support 41 in heat exchanging relation therewith and connected by means of leads sealed through the wall of the jar 43 to a heater power supply 53.

The body 10 to be surface polished is mounted on the electrode 42 and a similar body 32 is mounted on the support 41. The heater 50 is then activated to heat the body 10 to the desired temperature. Similarly the heater element 52 is activated to heat the body 32 to a temperature sufficiently high to evaporate material therefrom. The high voltage RF power supply is then activated to establish a high voltage RF field between the electrode 42 and the platform 40 sufficient to ionize the sputtering gas within the jar 43. Thus material will be sputtered from the surface of the body 10 and simultaneously material will be deposited thereon by evaporation from the body 32.

It will be noted that the support 41 and body 32 will be electrically floating within the RF field and in order to avoid undesirable effects, the support 41 may be connected to the platform 44 through a suitable adjustable resistor 55. Thus, the evaporation rate from the body 32 may be controlled by adjusting the heater power supply 53. Similarly, a sputtering rate from the surface of the body 10 may be controlled by adjusting the heater power supply 51 and by adjusting the voltage of the high voltage RF power supply 49 as well as the pressure of the sputtering gas within the jar 43 as is known in the art. This will enable the removal rate of material from the surface of the body 10 and the rate of deposition of material thereon from the body 32 to be controlled independently of each other so that the process according to the teaching of this invention may be optimized in terms of quality of the polished surface and the time required to achieve a given quality of polished surface.

Referring to FIG. 5, apparatus for practicing the process of this invention utilizing evaporation to effect removal of material from the surface to be polished and evaporation to deposit material thereon is illustrated schematically. Such apparatus comprises a bell jar 40A similar to that shown in FIG. 4 except that the platform 44A need not include means for introducing sputtering gas therein and the jar 43A includes a support 41A mounted somewhat closer to the electrode 42 than in FIG. 4. As described in connection with FIG. 4, the body 10 to be surface polished may be mounted on the electrode 42 and a body 32 of the same material as the body 10 is mounted on the support 41A directly opposite the surface of the body 10 to be polished.

Polishing according to the teaching of this invention is accomplished in the apparatus of FIG. 5 by first evacuating the jar 43A through the conduit 45 and then sealing the conduit 45 by means of the valve 46. The heating elements 50 and 52 are then energized by means of their heater power supplies 51 and 53, respectively, to heat the bodies 10 and 32 to appropriate high temperatures for evaporation of materials therefrom.

The heater power supplies 51 and 53 must be adjustable in their power output in accordance with the teaching of this invention and they could, of course, be combined into a single power supply with separate controls for the heater elements 50 and 52. As described hereinabove, the evaporation rates from the body 10 and the body 32 are adjusted so that the rate of evaporation of material from the body 32 is equal to or less than the rate of evaporation of material from the body 10. The exact relationship between the rates of evaporation from the bodies 10 and 32 are adjusted to optimize the process according to the teaching of this invention in terms of quality of the polished surface on the body 10 and the time required to achieve the desired quality of polished surface as discussed hereinabove.

Referring to FIG. 6, apparatus 60 for practicing the teaching of this invention utilizing a gaseous chemical reaction to remove material substantially atomically from the surface to be polished of a crystalline body 10 which may be of sapphire or the like, and redeposition of material on such surface by reflection of material removed is shown. Thus, the body 10 is mounted on a metallic support 61 within a dielectric tube 62 and a further metallic element 63 is mounted within the tube 62 opposite and substantially parallel to the surface of the body 10 to be polished. A flow of hydrogen gas having a substantial water content is established through the dielectric tubing 62 and the metallic support 61 and metal member 63 are heated to promote the chemical reaction between the body 10 and the wet hydrogen gas. Such heating of the mount 61 and member 63 may be accomplished, for example, by an induction coil 64 surrounding the dielectric tubing and connected to an appropriate RF power supply 65 in a manner well known in the induction heating art. The metallic member 63 is mounted within the tube 62 by an appropriate flexible sealing member 66 in order to allow adjustment of the spacing between the metal member 63 and the surface of the body 10 to be polished. The metal member 63 may be of tungsten or some other appropriate material that is nonreactive at high temperature. Thus, material removed from the surface of the body 10 to be polished by chemical reaction with the wet hydrogen gas will either contact the heated metal member 63 resulting in a reversal of the chemical reaction and a redeposition of material on the body 10, or the mere temperature and close spacing of the metal member 63 to the surface of the body 10 will cause redeposition of materials thereon. The temperature and spacing of the metal member 63 with respect to the body 10 may be adjusted to optimize the process according to the teaching of this invention in terms of quality of the polished surface and time required to achieve a desired quality as discussed hereinabove. The flow rate and moisture content of the hydrogen gas may also be adjusted as required to provide the desired removal and redeposition rate in accordance with the teaching of this invention.

It is believed that those skilled in the art will make various combinations of the removal and redeposition mechanisms disclosed hereinabove other than those specifically described herein without departing from the teaching of this invention. For example, removal of material by evaporation and reflection of evaporated material back onto the surface to be polished by means of a heated electrode could be used. Similarly, it would be possible to remove material by sputtering techniques and by appropriate formation of fields or the use of a heated metallic body to cause sputtered material to be returned to the surface to be polished. The various techniques for removing and redepositing material as described hereinabove in experimental type apparatus are well known in the art and may be easily adapted for mass production in appropriate apparatus by those skilled in the art. It is believed that surfaces which are atomically smooth and have no projections visible under magnification of 100,000× can be obtained on a mass production basis by appropriate optimization of the process of this invention as described hereinabove.

Although the bodies to be polished in accordance with this invention as shown in the drawing and described hereinabove are flat discs, bodies having surfaces of any complex shape may be polished according to the teaching of this invention. It is preferred that the body from which material is removed for deposition on the surface to be polished have a surface which matches the surface to be polished. Similarly, the reflecting surface should preferably match the surface to be polished. However, such matching surface may be larger or smaller in area than the surface to be polished. For example, in polishing the interior surface of a tubular body or a hole in a body, the reflecting body or body from which material is removed for deposition on the surface to be polished would take the form of a core or insert received within the tubular body or hole in spaced relation to the internal surface to be polished and would preferably have an exterior surface substantially matching such interior surface. It is believed that those skilled in the art will make other obvious adaptations of the teaching of this invention for the polishing of surfaces of other complex shapes.

What is claimed is:

1. The process of surface-polishing a crystalline body comprising the steps of:
    (a) heating said body to a temperature less than the melting temperature thereof and greater than two-thirds of said melting temperature thereof;
    (b) removing material from the surface of said body to be polished at a given rate and substantially atomically by sputtering;
    (c) simultaneously depositing material by sputtering of material from another body of the same composition as the material of said body substantially atomically on said surface of said body to be polished at a rate closely approaching and not substantially greater than said given rate of removal and
    (d) controlling at least one of said removal rate and said deposition rate independently of the other to establish and maintain a chemical non-equilibrium condition.

2. The process of surface-polishing a crystalline body comprising the steps of:
    (a) heating said body to a temperature less than the melting temperature thereof and greater than two-thirds of said melting temperature thereof;
    (b) removing material from the surface of said body to be polished at a given rate and substantially atomically by sputtering;
    (c) simultaneously depositing material by evaporation of material from another body of the same composition as the material of said body substantially atomically on said surface of said body to be polished at a rate closely approaching and not substantially greater than said given rate of removal and
    (d) controlling at least one of said removal rate and said deposition rate independently of the other to establish and maintain a chemical non-equilibrium condition.

3. The process of surface-polishing a crystalline body comprising the steps of:
    (a) heating said body to a temperature less than the melting temperature thereof and greater than two-thirds of said melting temperature thereof;

(b) removing material from the surface of said body to be polished at a given rate and substantially atomically by evaporation;

(c) simultaneously depositing material by evaporation of material from another body of the same composition as the material of said body substantially atomically on said surface of said body to be polished at a rate closely approaching and not substantially greater than said given rate of removal and (d) controlling at least one of said removal rate and said deposition rate independently of the other to establish and maintain a chemical non-equilibrium condition.

* * * * *